United States Patent [19]
Main

[11] Patent Number: 4,958,122
[45] Date of Patent: Sep. 18, 1990

[54] CURRENT SOURCE REGULATOR

[75] Inventor: William E. Main, Mesa, Ariz.

[73] Assignee: Motorola, Inc., Schaumburg, Ill.

[21] Appl. No.: 452,080

[22] Filed: Dec. 18, 1989

[51] Int. Cl.5 .................................... G05F 3/22
[52] U.S. Cl. .................................... 323/315; 323/317; 323/351
[58] Field of Search ............... 323/312, 315, 316, 317, 323/351, 349, 907, 22, 26, 28, 30

[56] References Cited

U.S. PATENT DOCUMENTS

| | | | |
|---|---|---|---|
| 4,437,023 | 3/1984 | Gill, Jr. | 323/315 |
| 4,450,366 | 5/1984 | Malhi et al. | 323/315 |
| 4,584,520 | 4/1986 | Vinn | 323/317 |
| 4,605,892 | 8/1986 | Seevinck et al. | 323/315 |
| 4,683,414 | 7/1987 | Moore | 323/315 |
| 4,733,163 | 3/1988 | Miller | 323/317 |
| 4,792,750 | 12/1988 | Yan | 323/315 |
| 4,810,902 | 3/1989 | Storti et al. | 323/317 |
| 4,918,370 | 4/1990 | Botti et al. | 323/351 |

*Primary Examiner*—Peter S. Wong
*Attorney, Agent, or Firm*—Michael D. Bingham

[57] ABSTRACT

A current source regulator is responsive to an enable signal and provides at least one output current of predetermined magnitude proportional to absolute temperature. The enable signal biases a first transistor for supplying current through its collector-emitter conduction path to the common base of a string of PNP transistors, the latter of which provide the output current. The current flowing in one of the PNP transistors flows through a regulating feedback circuit, the output of which regulates the base voltage of the first transistor to control the base voltage of the PNP transistors for maintaining the current flowing through the regulating feedback circuit at the predetermined value proportional to absolute temperature.

11 Claims, 1 Drawing Sheet

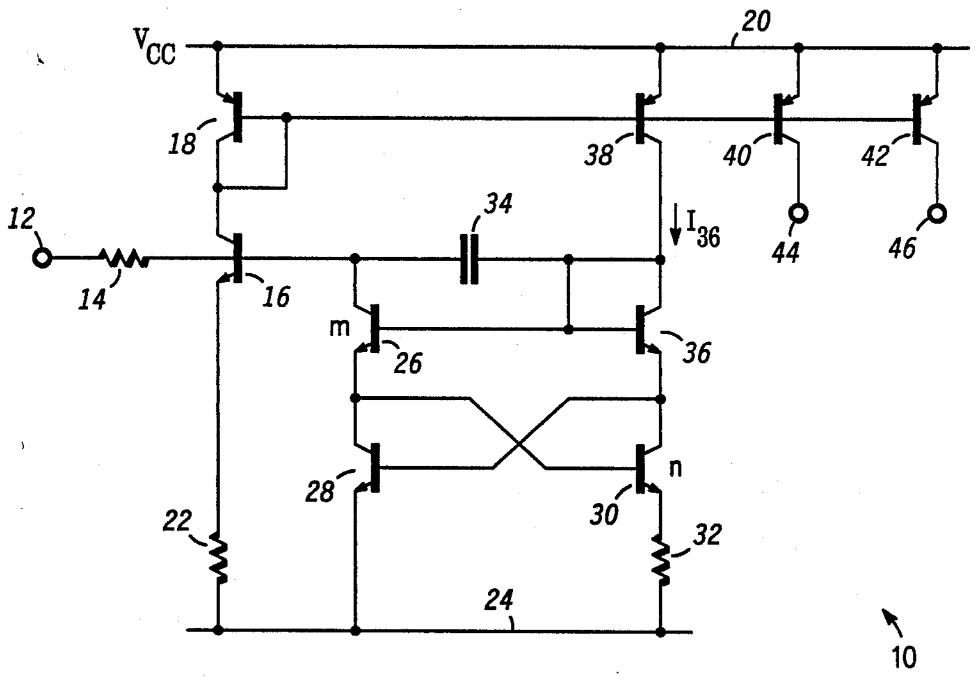
FIG. 1
FIG. 2
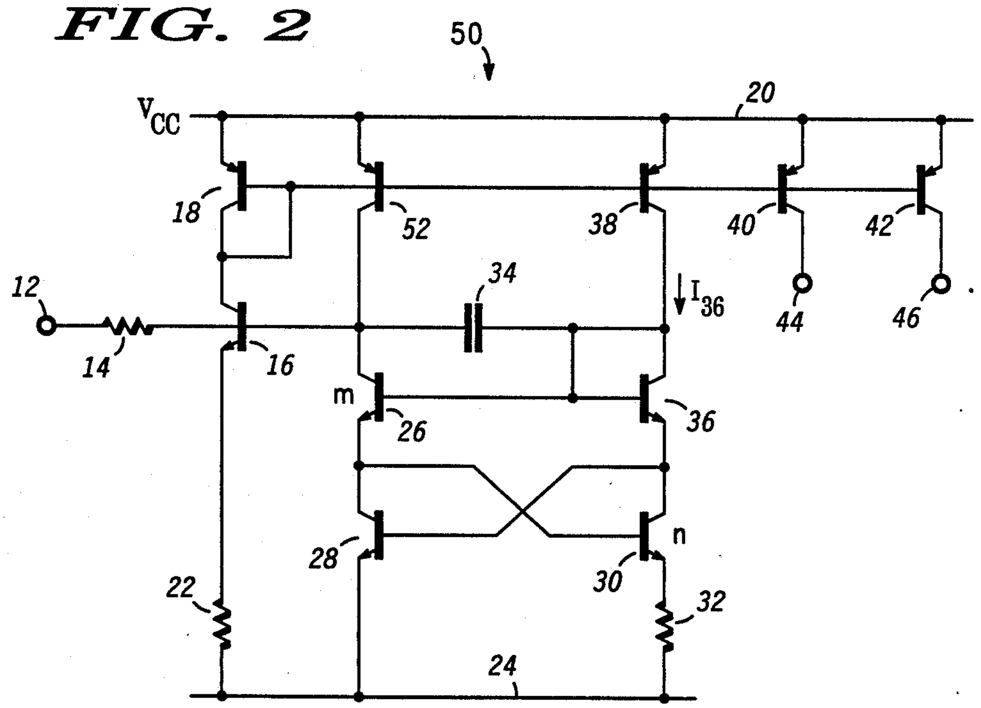

CURRENT SOURCE REGULATOR

BACKGROUND OF THE INVENTION

The present invention relates in general to regulating circuits, and more particularly, to a current source regulator for providing a predetermined output current proportional to absolute temperature and including an enable input whereby the current regulator may be disabled.

Current regulators are common in modern electronic circuits wherein a source of predetermined current independent of load and power supply voltage is required. A conventional current regulator may comprise a plurality of PNP transistors each conducting the same current flowing through an NPN transistor current mirror, the latter having a predetermined current ratio. The output impedance at the collectors of the PNP transistors is made very large such that changes in the load impedance are negligible. The conventional current regulator may also include an enable input at which an enable signal is applied for disabling the NPN current mirror and, accordingly, the output current. Although the conventional current regulating circuit may take many forms, most if not all of these are sensitive to variation of the enable signal and the inconsistency in the NPN current mirror ratio, both of which contribute to inaccuracy in the output current. The conventional regulator may also include a feedback loop for improving the regulation of the output current; however, this often involves adding considerable complexity to the design possibly limiting the bandwidth of the loop response to changes in the load and power supply voltage. In addition, such complex regulation loops often require excessive compensation for achieving an adequate phase margin to maintain stability.

Hence, there is a need for a simple current source regulator for providing a predetermined output current responsive to an enable signal for disabling the output current flow wherein the output current is invariant to both the enable signal and load.

SUMMARY OF THE INVENTION

Accordingly, it is an objective of the present invention to provide an improved current source regulator.

A further objective of the present invention is to provide an improved current source regulator for providing a predetermined output current proportional to absolute temperature.

Another objective of the present invention is to provide an improved current source regulator responsive to an enable signal for enabling and disabling the predetermined output current.

Still another objective of the present invention is to provide an improved current source regulator for providing a predetermined output current insensitive to variation of the enable signal.

Yet another objective of the present invention is to provide an improved current source regulator for providing a predetermined output current independent of variation of the load and power supply voltage.

In accordance with the above and other objectives there is provided an improved current source regulator including at least one output transistor having a base, an emitter coupled to a first source of operating potential and a collector for providing an output current of a predetermined value proportional to absolute temperature comprising a first transistor having a base responsive to an enable signal, an emitter coupled to a second source of operating potential and having a collector; a second transistor having a base coupled to the collector of the first transistor and to the base of the output transistor, an emitter coupled to a first source of operating potential and having a collector; and a feedback circuit coupled between the collector of the second transistor and the base of the first transistor for developing a potential at the base of the first transistor to control the potential developed at the base of the second transistor such that the current flowing through the latter is proportional to absolute temperature which also maintains the predetermined value of the output current proportional to absolute temperature.

BRIEF DESCRIPTION OF THE DRAWINGS

FIG. 1 is a schematic diagram illustrating the preferred embodiment of the present invention; and FIG. 2 is a schematic diagram illustrating an alternate embodiment of the present invention.

DETAILED DESCRIPTION OF THE PREFERRED EMBODIMENT

Referring to FIG. 1, current source regulator 10 of the present invention is suited to be manufactured in integrated circuit form using conventional integrated circuit processing techniques. Current source regulator 10 is responsive to an enable signal applied at input 12 for conducting current through resistor 14 into the base of transistor 16. The collector of transistor 16 is coupled to the collector and base of transistor 18, while the emitter of transistor 18 is coupled to power supply conductor 20, typically operating at a positive power supply voltage, $V_{CC}$. The emitter of transistor 16 is coupled through resistor 22 to power supply conductor 24, operating at ground potential, and the base of transistor 16 is coupled to the collector of transistor 26. The emitter of transistor 26 is coupled to the collector of transistor 28, while the emitter of transistor 28 is coupled to power supply conductor 24. The base and collector of transistor 28 are then cross coupled to the collector and base of transistor 30, as shown, and the emitter of transistor 30 is coupled through resistor 32 to power supply conductor 24. In addition, capacitor 34 is coupled between the collectors of transistor 26 and 36, the latter of which is also coupled to the bases of transistors 26 and 36 and the collector of transistor 38. The emitter of transistor 36 is coupled to the collector of transistor 30. The base of transistor 18 is coupled to the bases of transistors 38, 40 and 42, while the emitters of transistors 38, 40 and 42 are coupled to power supply conductor 20, and the collectors of the latter two (40 and 42) are coupled to outputs 44 and 46, respectively.

Current source regulator 10 is enabled with a high enable signal applied at input 12 whereby transistors 16 and 18 are rendered operative. The potential developed at the base of transistor 18 also turns on transistor 38 allowing current $I_{36}$ to flow through the collector-emitter conduction path of transistors 38, 36 and 30. The voltage developed at the collector of transistor 38 is applied to the input of a feedback circuit that is the base of transistor 36 supporting current $I_{36}$ and allowing current $I_{26}$ to flow through transistors 26 and 28. The emitter area of transistor 26 is made M times the emitter area of transistor 36, and the emitter area of transistor 30 is N times the emitter area of transistor 28, where M and N are positive numbers greater than or equal to one.

Thus, the base-emitter junction potential, $V_{be}$, of transistor 26 is equal to $V_{26}-kT/Q*\ln(M)$, where "kT/Q" is the quotient of Boltzmann's constant and absolute temperature to the electron charge, "ln" is the natural log function and voltage $V_{26}$ is base-emitter junction potential for M=1. The expression "kT/Q*ln (M)" is thus the incremental voltage due to the larger emitter area of transistor 26. Likewise, the $V_{be}$ of transistor 30 is equal to $V_{30}-kT/Q*\ln(N)$. Assuming ideal transistors having negligible base currents, the magnitude of current $I_{36}$ may be obtained from the following loop equation:

$$V_{28} + V_{36} - \left(V_{26} - \frac{kT}{Q}\ln M\right) - \left(V_{30} - \frac{kT}{Q}\ln N\right) - (I_{36} \times R_{32}) = 0 \qquad (1)$$

where:

$V_{28}=V_{be}$ of transistor 28
$V_{26}=V_{be}$ of transistor 26
$V_{30}=V_{be}$ of transistor 30
$V_{36}=V_{be}$ of transistor 36
$R_{32}$=value of resistor 32.

Since transistors 26 and 28 conduct equal current and transistors 30 and 36 conduct equal current, voltage $V_{28}$ is equal to voltage $V_{26}$ and voltage $V_{36}$ is equal to voltage $V_{30}$, and equation (1) may be reduced to:

$$I_{36} = \frac{kT}{Q}(\ln M + \ln N) \times \frac{1}{R_{32}} \qquad (2)$$

The emitter ratios M and N, the value of resistor 32 and the charge Q are each substantially constant, hence, the magnitude of current $I_{36}$ is proportional to absolute temperature, T. The nominal value of current $I_{36}$ is typically set via the value of resistor 32. The potential developed at the collector of transistor 26 establishes the current flowing through transistor 16 and, consequently, develops the voltage at the base of transistor 38 necessary for the latter to conduct current $I_{36}$, as defined in equation (2). The current flowing through the collector of transistor 16 provides the base current for PNP transistors 18, 38, 40 and 42. The base-emitter junction potentials of transistors 40 and 42 are equal to the $V_{be}$ of transistor 38, thus, the current flowing through these transistors is substantially equal to current $I_{36}$. Any variation in the power supply voltage is seen across the base-emitter junction of transistor 38 and corrected in the feedback circuit loop to maintain the predetermined value of current $I_{36}$. Hence, cross-coupled transistors 28 and 30 and transistors 26 and 36 operate as a high gain feedback circuit wherein small changes in the input signal at the base of transistor 36 are amplified through the output signal provided at the collector of transistor 26 due to the difference in emitter areas of transistors 26–36 and transistors 28–30. The large loop gain of the feedbck circuit encourages the use of capacitor 34 coupled between the collectors of transistors 26 and 36 for providing a dominate pole in the transfer function to compensate the response whereby the phase margin is maintained at a value much greater than zero, typically 75°. The potential developed across resistor 22 provides a voltage offset at the emitter of transistor 16 for increasing the potential at the collector of transistor 26 necessary to conduct the current through transistor 16 needed to provide the required voltage at the base of transistor 38 for maintaining current $I_{36}$. The higher output signal of the feedback circuit increases the effectiveness of capacitor 34.

As previously stated, the enable signal applied at input 12 initiates the operation of current source regulator 10. Once operating in steady state, any fluctuation of the enable signal is sunk through transistor 26 thereby desensitizing the output current to the variation thereof. Although the control of the output current is maintained via incremental changes in the output signal of feedback circuit provided at the collector of transistor 26 in response to load and power supply variation, the current provided through resistor 14 is required during operation for maintaining the bias at the base of transistor 16. Notably, current source regulator 10 may be disabled with a low signal applied at input 12. Typically, input 12 is coupled to power supply conductor 20 whereby the output current is disabled when the power supply voltage reduces to a predetermined low level. Transistor 18 is optional, but provides the desirable feature of increasing operating current of transistor 16 desensitizing the latter to the unpredictable and possibly large variation in the base currents of transistors 38, 40 and 42.

Referring to FIG. 2, the components of current source regulator 50 are identical to those of current source regulator 10 with the addition of transistor 52 wherein the emitter of transistor 52 is coupled to power supply conductor 20, while its base and collector are coupled to the collector and base of transistor 16, respectively. The operation of current source regulator 50 follows the aforedescribed operation less the requirement for steady state bias current through resistor 14. Once the feedback loop is started, the enable signal is no longer required since the collector-emitter conduction path of transistor 52 provides the bias for the base of transistor 16. Hence, the value of resistor 22 may be made large limiting the current therethrough and reducing the power consumption.

Hence, what has been described is a novel current source regulator for providing a predetermined output current proportional to absolute temperature and responsive to an enable signal for disabling the output current flow wherein the output current is invariant to the enable signal and the load.

I claim:

1. A current source regulator including at least one output transistor having a base, an emitter coupled to a first source of operating potential and a collector for providing an output current of a predetermined magnitude proportional to absolute temperature, comprising:

- a first transistor having a base, an emitter and a collector, said base being responsive to an enable signal, said emitter being coupled to a second source of operating potential;
- a second transistor having a base, an emitter and a collector, said base being coupled to said collector of said first transistor and to the base of the output transistor, said emitter being coupled to the first source of operating potential; and
- a feedback circuit coupled between said collector of said second transistor and said base of said first transistor for developing a potential at said base of said first transistor to control the potential developed at said base of said second transistor such that the current flowing through the latter is proportional to absolute temperature which also maintains the predetermined magnitude of the output current proportional to absolute temperature.

2. The current source regulator of claim 1 further comprising:

a third transistor having a base, an emitter and a collector, said base and collector being coupled together to said collector of said first transistor, said emitter being coupled to the first source of operating potential; and a first resistor coupled between said emitter of said first transistor and said second source of operating potential.

3. The current source regulator of claim 2 wherein said feedback circuit comprises:

a fourth transistor having a collector coupled to said base of said first transistor and having a base and an emitter;

a fifth transistor having a base, an emitter and a collector, said base and collector being coupled together to said base of said fourth transistor and to said collector of said second transistor;

capacitive means coupled between said collectors of said fourth and fifth transistors;

a sixth transistor having a base, an emitter and a collector, said collector being coupled to said emitter of said fourth transistor, said emitter being coupled to said second source of operating potential;

a seventh transistor having a base, an emitter and a collector, said base being coupled to said collector of said sixth transistor, said collector being coupled to said base of said sixth transistor and to said emitter of said fifth transistor; and a second resistor coupled between said emitter of said seventh transistor and said second source of operating potential.

4. The current source regulator of claim 3 further comprising an eighth transistor having a base, an emitter and a collector, said base being coupled to said base of said second transistor, said emitter being coupled to the first source of operating potential, said collector being coupled to said base of said first transistor.

5. A current regulator having an input coupled for receiving an enable signal and having an output for providing a predetermined output current proportional to absolute temperature, comprising:

a first transistor having a base, an emitter and a collector, said base being responsive to the enable signal, said emitter being coupled to a first source of operating potential;

a second transistor having a base, an emitter and a collector, said base being coupled to said collector of said first transistor, said emitter being coupled to a second source of operating potential;

a third transistor having a collector coupled to said base of said first transistor and having a base and an emitter;

a fourth transistor having a base, an emitter and a collector, said base and collector being coupled to said base of said third transistor and to said collector of said second transistor;

capacitive means coupled between said collectors of said third and fourth transistors;

a fifth transistor having a base, an emitter and a collector, said collector being coupled to said emitter of said third transistor, said emitter being coupled to said first source of operating potential;

a sixth transistor having a base, an emitter and a collector, said base being coupled to said emitter of said third transistor, said collector being coupled to said base of said fifth transistor and to said emitter of said fourth transistor;

a first resistor coupled between said emitter of said sixth transistor and said first source of operating potential; and a seventh transistor having a base, an emitter and a collector, said base being coupled to said base of said second transistor, said emitter being coupled to said second source of operating potential, said collector being coupled to the output.

6. The current regulator of claim 5 further comprising:

an eighth transistor having a base, an emitter and a collector, said base and collector being coupled together to said collector of said first transistor, said emitter being coupled to said second source of operating potential; and a second resistor coupled between said emitter of said first transistor and said first source of operating potential.

7. The current regulator of claim 6 further comprising a ninth transistor having a base, an emitter and a collector, said base being coupled to said base of said second transistor, said emitter being coupled to said second source of operating potential, said collector being coupled to said base of said first transistor.

8. An integrated current source regulator including at least one output transistor having a base, an emitter coupled to a first source of operating potential and a collector for providing an output current of a predetermined magnitude proportional to absolute temperature, comprising:

a first transistor having a base, an emitter and a collector, said base being responsive to an enable signal, said emitter being coupled to a second source of operating potential;

a second transistor having a base, an emitter and a collector, said base being coupled to said collector of said first transistor and to the base of the output transistor, said emitter being coupled to the first source of operating potential; and a feedback circuit coupled between said collector of said second transistor and said base of said first transistor for developing a potential at said base of said first transistor to control the potential developed at said base of said second transistor such that the current flowing through the latter is proportional to absolute temperature which also maintains the predetermined magnitude of the output current proportional to absolute temperature.

9. The current source regulator of claim 8 further comprising:

a third transistor having a base, an emitter and a collector, said base and collector being coupled together to said collector of said first transistor, said emitter being coupled to the first source of operating potential; and a first resistor coupled between said emitter of said first transistor and said second source of operating potential.

10. The current source regulator of claim 9 wherein said feedback circuit comprises:

a fourth transistor having a collector coupled to said base of said first transistor and having a base and an emitter;

a fifth transistor having a base, an emitter and a collector, said base and collector being coupled together to said base of said fourth transistor and to said collector of said second transistor;

capacitive means coupled between said collectors of said fourth and fifth transistors;

a sixth transistor having a base, an emitter and a collector, said collector being coupled to said emitter of said fourth transistor, said emitter being coupled to said second source of operating potential;

a seventh transistor having a base, an emitter and a collector, said base being coupled to said collector of said sixth transistor, said collector being coupled to said base of said sixth transistor and to said emitter of said fifth transistor; and a second resistor coupled between said emitter of said seventh transistor and said second source of operating potential.

11. The current source regulator of claim 10 further comprising an eighth transistor having a base, an emitter and a collector, said base being coupled to said base of said second transistor, said emitter being coupled to the first source of operating potential, said collector being coupled to said base of said first transistor.

* * * * *